United States Patent
Amou et al.

(10) Patent No.: US 8,227,361 B2
(45) Date of Patent: Jul. 24, 2012

(54) PREPREG AND PRINTED WIRING BOARD USING THIN QUARTZ GLASS CLOTH

(75) Inventors: Satoru Amou, Hitachi (JP); Hiroshi Shimizu, Chikusei (JP); Akinori Hanawa, Shimotsuma (JP)

(73) Assignee: Hitachi Chemical Company, Ltd., Tokyo (JP)

(*) Notice: Subject to any disclaimer, the term of this patent is extended or adjusted under 35 U.S.C. 154(b) by 552 days.

(21) Appl. No.: 12/453,029

(22) Filed: Apr. 28, 2009

(65) Prior Publication Data

US 2009/0266591 A1    Oct. 29, 2009

(30) Foreign Application Priority Data

Apr. 28, 2008    (JP) .................. 2008-117230

(51) Int. Cl.
B32B 17/02    (2006.01)
B32B 27/04    (2006.01)
(52) U.S. Cl. ...................... 442/180; 442/110
(58) Field of Classification Search .................. 442/110, 442/180
See application file for complete search history.

(56) References Cited

U.S. PATENT DOCUMENTS

| 4,937,132 A * | 6/1990 | Gaku et al. ............ 428/209 |
| 7,273,900 B2 | 9/2007 | Amou et al. |
| 2007/0077413 A1 | 4/2007 | Amou et al. |
| 2008/0090478 A1 | 4/2008 | Amou et al. |
| 2008/0261472 A1 | 10/2008 | Amou et al. |

FOREIGN PATENT DOCUMENTS

| JP | 08-208856 | 8/1996 |
| JP | 09-074255 | 3/1997 |
| JP | 09-246429 | 9/1997 |
| JP | 11-124491 | 5/1999 |
| JP | 2002-249531 | 9/2002 |
| JP | 2005-089691 | 4/2005 |
| JP | 2005-336695 | 12/2005 |
| JP | 2006-282401 | 10/2006 |
| JP | 2007-099893 | 4/2007 |
| JP | 2007-239143 | 9/2007 |
| JP | 2008-094889 | 4/2008 |
| JP | 2008-266408 | 11/2008 |
| KR | 10-2005-0028779 | 3/2005 |

OTHER PUBLICATIONS

Japanese Official Action dated Jun. 29, 2010, for Application No. 2008-117230.
Korean Official Action dated Mar. 16, 2011, for KR Application No. 10-2009-0036652.

* cited by examiner

Primary Examiner — Lynda Salvatore
(74) Attorney, Agent, or Firm — Antonelli, Terry, Stout & Kraus, LLP.

(57) ABSTRACT

It is an object of the present invention to provide a high frequency-capable printed wiring board material reduced in the dielectric loss tangent, weight, thickness and cost without compromising the workability, and provide electronic components using the same. The present invention provides a prepreg obtained by using a quartz glass cloth composed of low-density quartz glass fibers as a base material and impregnating the cloth with a thermosetting resin composition having a low dielectric loss tangent, and provides electronic components using a cured product of the prepreg as an insulating layer.

19 Claims, 3 Drawing Sheets

BEFORE PRESS

AFTER PRESS

PREPREG AND PRINTED WIRING BOARD USING THIN QUARTZ GLASS CLOTH

BACKGROUND OF THE INVENTION

1. Field of the Invention

The present invention relates to a multilayer printed wiring board and a printed wiring board that have a small dielectric loss to adapt to high-frequency signals, and a prepreg and a laminate such as a multilayer printed board that are used for manufacturing the wiring boards.

2. Background Art

In recent years, signal bands of information communication apparatuses such as PHS and cellular phones, and CPU clock times of computers have reached GHz bands and using higher frequencies has progressed. The transmission loss of electric signals is expressed by the sum of dielectric loss, conductor loss and radiation loss, and there is such a relation that a higher frequency of electric signals effects a higher dielectric loss, conductor loss and radiation loss. Since the transmission loss attenuates electric signals to damage the reliability of the electric signals, in printed wiring boards handling high-frequency signals, it is necessary to suppress increases in dielectric loss, conductor loss and radiation loss. The dielectric loss is proportional to the product of a square root of a relative permittivity of an insulator on which circuits are formed, a dielectric loss tangent, and a frequency of signals used. Therefore, selection of an insulating material having a low relative permittivity and dielectric loss tangent as an insulator can suppress an increase in dielectric loss.

Examples of typical resin materials having a low permittivity and a low dielectric loss tangent include fluororesins such as polytetrafluoroethylene (PTFE). Since fluororesins have both a low relative permittivity and a low dielectric loss tangent, they have been used for board materials handling high-frequency signals for a long time. By contrast, various types of non-fluoro insulating materials have been studied which can easily been made into varnishes by an organic solvent, and have a low molding temperature and curing temperature, easy handling, and a low permittivity and dielectric loss tangent. The non-fluoro insulating materials include an example described in JP Patent Publication (Kokai) No. 08-208856A (1996) in which a diene polymer such as polybutadiene is impregnated in a glass cloth and cured with a peroxide. They further include examples described in JP Patent Publication (Kokai) No. 11-124491A (1999) in which a cyanate ester, a dienic polymer and an epoxy resin are heated to be made into B-stage. They further include an example described in JP Patent Publication (Kokai) No. 09-246429A (1997) of a resin composition composed of an allylated polyphenylene ether, a triallyl isocyanate and the like, examples described in JP Patent Publication (Kokai) No. 2002-249531A and JP Patent Publication (Kokai) No. 2005-89691A in which polyfunctional styrene compounds wholly having hydrocarbon skeletons are used as crosslinking components, and many other examples.

On the other hand, insulating layers of printed wiring boards often contain a glass cloth as a base material; and various studies on making the base material into a low-permittivity one and a low-dielectric loss tangent one have been carried out. The examples include an NE glass cloth described in JP Patent Publication (Kokai) No. 9-74255A (1997) in which the formulation ratio of silicon oxide, aluminum oxide and boron oxide is prescribed, a glass cloth described in JP Patent Publication (Kokai) No. 2005-336695A in which a quartz glass fiber and a non-quartz glass fiber are composited, and a fine quartz glass fiber of 7 μm or less in diameter and a manufacturing method of a cloth using the fiber described in JP Patent Publication (Kokai) No. 2006-282401A. Compositing a resin composition and a glass cloth having low permittivities and low dielectric loss tangents can provide an insulating material for printed wiring boards excellent in dielectric properties, mechanical properties such as strength as well as thermal properties such as thermal expansion.

SUMMARY OF THE INVENTION

Although the NE glass cloth described in JP Patent Publication (Kokai) No. 9-74255A (1997) and the glass cloth described in JP Patent Publication (Kokai) No. 2005-336695A manufactured from a quartz glass fiber and a non-quartz glass fiber are expected to improve more in boring workability by a drill or the like than quartz glass cloths, their dielectric loss tangent is larger than that of the quartz glass cloths and they are not sufficiently satisfactory as a base material of future substrate materials for high frequencies. Future substrate materials for high-frequency devices are required to have a low loss performance, that is, a low dielectric loss tangent performance, in a quartz glass level. JP Patent Publication (Kokai) No. 2005-89691A discloses printed wiring board materials including a prepreg, a laminate, a printed wiring board and a multilayer printed wiring board, in which a resin composition using a polyfunctional styrene compound having a very low dielectric loss tangent as a crosslinking component has been impregnated in a quartz glass cloth; and the dielectric loss tangent of their insulating layer exhibits a very excellent characteristic of 0.0009 at 10 GHz. However, the laminate, printed wiring board and multilayer printed wiring board in their structures lack consideration to boring workability. That is, quartz glass cloths are very hard, and inferior in boring workability by a drill or the like to common glass cloths. Quartz glass fibers used for fabrication of quartz glass cloths exhibit a low productivity, and have problems with stable supply and cost. The quartz glass cloth fabricated from a fine quartz glass fiber as described in JP Patent Publication (Kokai) No. 2006-282401A is such that the improvement in boring workability is attempted by making the quartz glass fiber fine, which is promising in view of workability, but uses fibers of 4 μm in filament diameter, therefore having a risk of decrease in productivity on weaving cloths because such a fine quartz glass fiber is liable to be cut.

The present invention has a first object to provide a prepreg of a thin film type and a laminate in which the amount used of a quartz glass fiber is reduced to respond to the small production amount of the quartz glass fiber by applying a quartz glass cloth having a low fiber density of the quartz glass fibers while boring workability of a printed wiring board is improved and the cost increase by application of the quartz glass fiber is suppressed, and a printed wiring board and a multilayer printed wiring board using the same. The present invention further provides a technology to further reduce the thickness of insulating layers of the laminate, printed wiring board and multilayer printed wiring board by opening yarns of a quartz glass cloth in a prepreg in the molding and curing process of the prepreg by using the effect of a quartz glass cloth having a low fiber density of the quartz glass fibers.

The gist of the present invention to solve the problems described above is as follows.

(1) A prepreg obtained by compositing a quartz glass cloth, which is fabricated using a quartz yarn comprising a quartz glass fiber as a main component and has a low fiber density of the quartz glass fiber, and a thermosetting resin composition, which has a dielectric loss tangent after curing of 0.003 or less, wherein the prepreg has a thickness of 30 to 60 μm.

(2) The prepreg according to (1) described above, wherein the quartz glass cloth is fabricated using a quartz yarn comprising 15 to 49 quartz glass fibers having a filament diameter of 5 to 9 μm, and has weaving densities of warp yarn and weft yarn each of 30 to 70 yarns/25 mm.

(3) The prepreg according to (1) or (2) described above, wherein the quartz yarn of the quartz glass cloth is opened.

(4) The prepreg according to any one of (1) to (3) described above, wherein the prepreg has a content of the thermosetting resin composition of 50 to 80% by weight.

(5) The prepreg according to any one of (1) to (4) described above, wherein the thermosetting resin composition comprises: at least one crosslinking component selected from a polybutadiene represented by the formula (1), a polyfunctional styrene compound represented by the formula (2), a bismaleimide compound represented by the formula (3) and a thermosetting polyphenylene ether; a hydrogenated styrene-butadiene copolymer; a silicon oxide filler; and a flame retardant having a structure represented by the formula (4) or the formula (5):

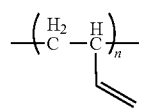

(1)

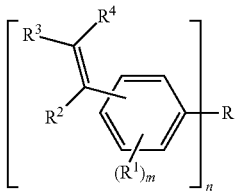

(2)

wherein R represents a hydrocarbon skeleton; $R^1$s are the same or different, and represent hydrogen or a hydrocarbon group having 1 to 20 carbon atoms; $R^2$, $R^3$ and $R^4$ are the same or different, and represent hydrogen or a hydrocarbon group having 1 to 6 carbon atoms; m is an integer of 1 to 4, and n is an integer of 2 or more; and a polyfunctional styrene compound represented by the formula (2) has a weight-average molecular weight in terms of polystyrene of 1,000 or less,

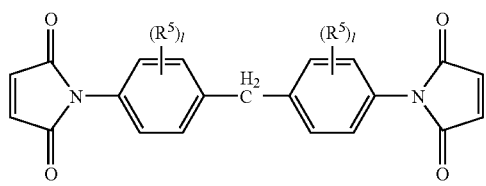

(3)

wherein $R^5$s are the same or different, and represent a hydrocarbon group having 1 to 4 carbon atoms; and l represents an integer of 1 to 4,

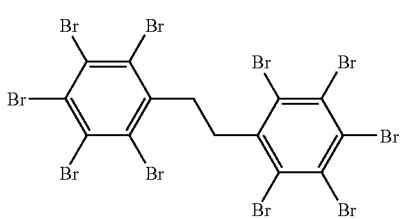

(4)

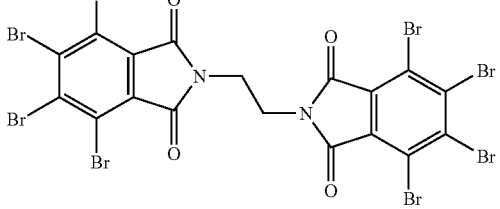

(5)

(6) The prepreg according to (5) described above, wherein the thermosetting resin composition further comprises a polymerization inhibitor or a polymerization initiator.

(7) The prepreg according to (5) or (6) described above, wherein a cured product of the thermosetting resin composition has a thermal expansion coefficient at 50 to 100° C. of 50 ppm/° C. or less.

(8) The prepreg according to (5) or (6), wherein a cured product of the thermosetting resin composition has a storage elastic modulus at 20° C. of 300 to 1,700 MPa.

(9) A laminate having a conductor layer(s) on both surfaces or one surface of an insulating layer made of a cured product of the prepreg according to any one of (1) to (8) described above.

(10) The laminate according to (9) described above, wherein the insulating layer has a thickness of 10 to 50 μm.

(11) The laminate according to (9) or (10) described above, wherein the quartz yarn of the quartz glass cloth is at least partially opened.

(12) A printed wiring board having a conductor wiring(s) on both surfaces or one surface of an insulating layer made of a cured product of the prepreg according to any one of (1) to (8) described above.

(13) The printed wiring board according to (12) described above, wherein the insulating layer has a thickness of 10 to 50 μm.

(14) The printed wiring board according to (12) or (13) described above, wherein the quartz yarn of the quartz glass cloth is at least partially opened.

(15) A multilayer printed wiring board obtained by laminating a plurality of insulating layers made of a cured product of the prepreg according to any one of (1) to (8) described above with a conductor wiring layer interposed between two insulating layers.

(16) The multilayer printed wiring board according to (15) described above, wherein the insulating layer has a thickness of 10 μm to 50 μm.

(17) The multilayer printed wiring board according to (15) or (16) described above, wherein the quartz yarn of the quartz glass cloth is at least partially opened.

(18) An electronic component having a circuit to transmit an electric signal of 1 GHz or more, wherein the electronic component comprises a cured product of the prepreg according to any one of (1) to (8) described above used as an insulating layer of the electronic component.

According to the present invention, the prepreg has a low permittivity and dielectric loss tangent since the prepreg is composed of a resin and a quartz glass cloth having low dielectric loss tangents; therefore, the prepreg is suitable as an insulating material for electronic components for high frequencies. Further according to the present invention using the prepreg of a thin film type as a starting material for a laminate, printed wiring board and multilayer printed wiring board, the amount used of a quartz glass fiber can be suppressed to respond to an unstable quartz glass fiber supply and achieve the cost reduction, and the boring workability is more improved than the cases using conventional quartz glass cloths. Further, since the amounts used per unit area of an insulating layer of a quartz glass cloth, a resin material, a solvent for making a varnish and the like can be reduced, the prepreg can contribute to reduction of environmental loads by manufacture of electronic components for high frequencies.

DESCRIPTION OF SYMBOLS

Figure 1:
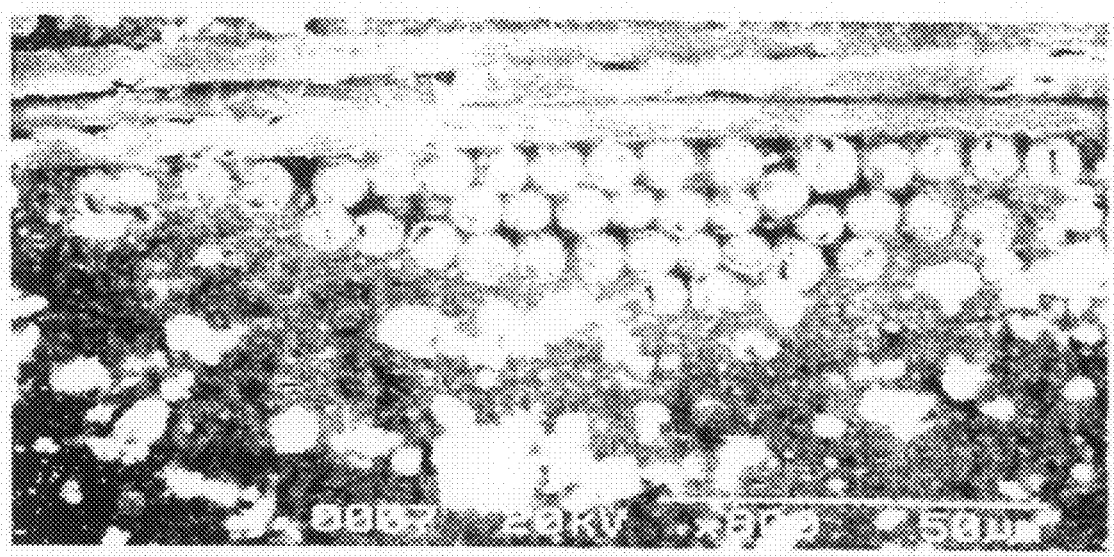
FIG. 1 is cross-sectional photographs before and after press work of the prepreg of the present invention.
Figure 1:
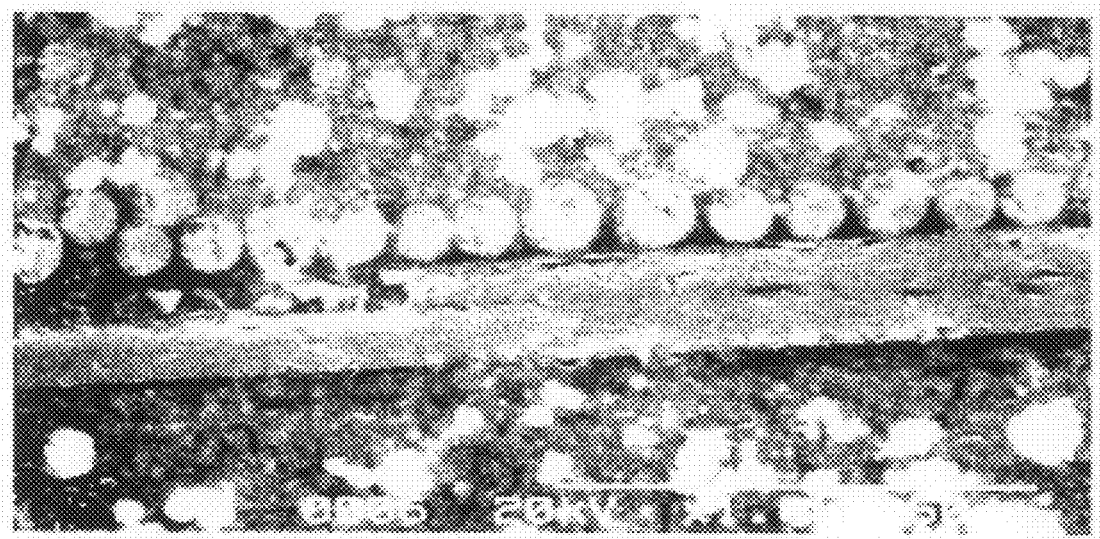

1 Copper foil
2 Prepreg
3 Photo resist antenna pattern
4 Photo resist through-hole pattern
5 Antenna pattern
6 Through-hole pattern
7 Wiring pattern
8 Through-hole
9 Silver paste
10 Ground

DETAILED DESCRIPTION OF THE PREFERRED EMBODIMENTS

Hereinafter, the present invention will be described in detail.

In the field of printed wiring board materials, in order to make an insulating layer having a low dielectric loss tangent, the dielectric loss tangent of a resin material as well as the dielectric loss tangent of a cloth material as a base material must be reduced. Among conventionally known cloth materials, the dielectric loss tangent of quartz glass cloths is less than 0.001 at 10 GHz, which is the best. However, quartz glass cloths are not prevalent in the consumer field for reasons that the low productivity of the quartz glass fiber results in low production volume and high cost, and the workability has a problem such as low drill workability, and other reasons. The present invention simultaneously achieves the reduction of the amount used of a quartz glass fiber per one layer of an insulating layer, the improvement in the boring workability, the reductions of the amounts used of a resin and a cloth material and the costs per unit area, and the reduction of the dielectric loss tangent of the insulating layer, by using a prepreg of a thin film type which is obtained by compositing a quartz glass cloth fabricated using a quartz yarn comprising a quartz glass fiber as a main component and having a low fiber density of the quartz glass fibers with a thermosetting resin composition whose dielectric loss tangent after curing is 0.003 or less, and which has a thickness of 30 to 60 µm. Here, "having a low fiber density of quartz glass fibers" means a state that in the case where a quartz yarn is disintegrated into individual quartz glass fibers, the number of the quartz glass fibers constituting the quartz yarns is reduced to such a degree that the quartz glass fibers are distributed uniformly in spaces between the quartz yarns and a layer thinner as a whole of the quartz glass fibers can be formed. According to this technique, the layer thicknesses of a quartz glass cloth, a prepreg and a laminate constituted of a cured product of the prepreg can be reduced without remarkably reducing the diameter of the quartz glass fiber. The thickness reduction of a prepreg depending on the reduction of the quartz glass fiber diameter causes easy cutting of fine quartz glass fibers to leave problems with the productivity and quality of the cloth.

A preferable constitution of a quartz glass cloth used in the present invention is a quartz glass cloth fabricated using a quartz yarn containing 15 to 49 fibers of fused quartz glass fibers of 5 to 9 µm in filament diameter, and a coarse quartz glass cloth which has weaving densities of warp yarn and weft yarn of 30 to 70 yarns/25 mm, a weight per unit area of 10 to 18 g/m$^2$, and a thickness of 15 to 30 µm. The quartz glass cloth is impregnated with a thermosetting resin composition having a low dielectric loss tangent, and dried, and as required, the impregnated resin composition is semi-cured, to obtain a prepreg of a thin film type.

The quartz glass cloth used in the present invention may be such that the quartz yarns are opened by air blow or the like. "Open" means that fibers forming yarns are disintegrated. Such a treatment can make a quartz glass cloth thinner.

The content rate of a resin composition in a prepreg is preferably 50 to 80% by weight. If a thermosetting resin composition is impregnated in the range described above to a quartz glass cloth, the opening of the quartz glass cloth is caused at a later press work to fabricate a laminate, enabling the thickness of a prepreg cured product to be made thin to 60 to 80% of the thickness of the original prepreg. Since a laminate containing the opened quartz glass cloth has a small variation in the in-plane quartz glass fiber density, and there are generated few portions where the quartz glass fibers are convergently present, the boring workability can further be improved.

In order to open fibers at press work, securing the fluidity and the space for the fibers to move in is important. A large number of fibers constituting a yarn causes entanglement of the fibers and decreases the fluidity, thereby not generating a sufficient fiber opening. By contrast, a too small number of fibers decreases the handleability of cloths, so the number of fibers forming a yarn is preferably in the range of 15 to 49, and more preferably 30 to 40. A high yarn weaving density results in a small fiber-moving space, thereby not generating a sufficient fiber opening. By contrast, a too low weaving density results in decreasing the handleability of cloths, which is not preferable. From the above, the preferable weaving density is 30 to 70 yarns/25 mm. The preferable diameter of a quartz glass fiber is 5 to 9 µm in view of the productivity and handleability of the fiber. The quartz glass cloth meeting such conditions has a weight per unit area of 10 to 18 g/m$^2$ and a thickness of 15 to 30 µm.

In the present invention, if the content rate of a resin composition in a prepreg is lower than 50% by weight, a sufficient fluidity cannot be secured and the fiber opening is insufficient in some cases; and if that exceeds 80% by weight, a sufficiently low dielectric loss tangent cannot be obtained in some cases due to an influence of dielectric properties of the thermosetting resin composition. The preferable content rate of the resin composition is in the range of 50 to 80% by weight.

The quartz glass cloth used in the present invention is preferably subjected to a surface treatment on the fiber surface with a silane coupling agent. Thereby, the adhesiveness of a cloth base material with a resin is increasingly improved and thermal properties such as solder heat resistance after moisture absorption are increasingly improved. Specific examples of silane coupling agents include γ-methacryloxypropyldimethoxysilane, γ-methacryloxypropyltrimethoxysilane, γ-methacryloxypropyltriethoxysilane, vinyltrimethoxysilane, vinyltriethoxysilane, vinyltris(β- methoxyethoxy)silane, and p-styryltrimethoxysilane. Especially, a vinylic silane coupling agent is preferably used which gives a stable treated surface and has a functional group chemically bondable with a thermosetting resin composition.

The thermosetting resin composition is preferably such that a cured product thereof has a dielectric loss tangent of 0.003 or less at operating frequencies of electronic components, and more preferably such that the cured product has a dielectric loss tangent of 0.003 or less at 10 GHz. The cured product of the resin composition has preferably a storage elastic modulus at 20° C. of 300 to 1,700 MPa. Examples of such resin compositions include thermosetting resin compositions containing at least one crosslinking component selected from polybutadiene, polyfunctional styrene compounds, bismaleimide compounds and thermosetting polyphenylene ethers, a hydrogenated styrene-butadiene copolymer, a silicon oxide filler and a flame retardant.

The particle diameter of the silicon oxide filler preferably used in the present invention is not especially limited, but the addition of a small-diameter filler is preferable which does not cause remarkable precipitation in a varnish of a thermosetting resin composition, and largely contributes to making the thermal expansion of the resin composition low due to the large surface area of the filler. From such a viewpoint, the particle diameter of the silicon oxide filler is preferably 10 μm or less, and more preferably in the range of 0.2 to 3 μm. The silicon oxide filler is preferably used by subjecting it to a surface treatment on its surface with a silane coupling agent in view of improvement in dielectric properties, low moisture absorption, and low solder heat resistance. The surface treatment of a silicon oxide filler with a coupling agent may involve addition of a filler previously subjected to a surface treatment to a resin composition, or the addition of a silane coupling agent to a resin composition and the surface treatment during adjustment of the resin composition. Silane coupling agents preferably used in the present invention are exemplified by γ-methacryloxypropyldimethoxysilane, γ-methacryloxypropyltrimethoxysilane, γ-methacryloxypropyltriethoxysilane, vinyltrimethoxysilane, vinyltriethoxysilane, vinyltris(β-methoxyethoxy)silane, and p-styryltrimethoxysilane. The addition amount of a silicon oxide filler subjected to such a treatment is preferably adjusted such that a cured product of a resin composition obtained by compositing with a resin material has a thermal expansion coefficient at 50 to 100° C. of 50 ppm/° C. or less, and more preferably 30 ppm/° C. or less. The thermal expansion coefficient is influenced by a thermal expansion coefficient of a resin itself, but specifically, preferably approximately 150 parts by weight or more of, and more preferably approximately 300 parts by weight or more of the filler is added to 100 parts by weight of a resin component. The limit of the addition amount of a silicon oxide filler is supposed to be approximately 75% by volume for a spherical filler, and, provided that the specific gravity of a resin component is 1 g/cm³ and the specific gravity of a silicon oxide filler is 2.65 g/cm³, the limit is 796 parts by weight to 100 parts by weight of the resin component. The addition amount of a silicon oxide filler in consideration of moldability, adhesiveness and the like is desirably about 400 parts by weight or less. A prepreg fabricated using such a thermosetting resin composition exhibiting a low thermal expansion is preferably applied to a laminate, printed wiring board and multilayer printed wiring board of a rigid type.

As crosslinking components of the resin composition in the present invention, polybutadiene compounds and polyfunctional styrene compounds formed of hydrocarbon skeletons are preferably used, and further, among compounds having hetero atoms in their structures, bismaleimide compounds having a specified structure and curable polyphenylene ether compounds are preferably used, in view of making the dielectric loss tangent of a cured product low. Cured products containing these crosslinking components have low dielectric loss tangents. Hereinafter, specific examples of crosslinking components will be described.

Examples of polybutadiene compounds include polybutadienes having vinyl groups on the side chains as shown in the formula (1) below, and are preferably polybutadienes having 1,2-bonds accounting for 90% by weight or more in their structure in view of curability and the improved thermal resistance of their cured product. Specific examples include liquid polybutadienes having a number-average molecular weight of 1,000 to 3,000, B1000, B2000 and B3000 made by Nippon Soda Co., Ltd., and solid polybutadienes having a number-average molecular weight exceeding 100,000, RB810, RB820 and RB830 made by JSR Corp. These polybutadienes having different molecular weights can be used singly or by compositing them. The polybutadiene compound of the present invention can be adjusted optionally for the elastic modulus of its cured product by the addition amount of a polymerization initiator such as a radical polymerization initiator. A prepreg fabricated from a resin composition providing a cured product having a low elastic modulus is preferably applied to flexible laminates, printed wiring boards and multilayer printed wiring boards.

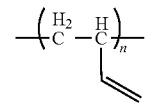

(1)

As polyfunctional styrene compounds, compounds represented by the formula (2) below can be used. In the formula, R represents a hydrocarbon skeleton; R¹s are the same or different, and represent hydrogen or a hydrocarbon group having 1 to 20 carbon atoms, such as an alkyl group, an alkenyl group and an alkynyl group; R², R³ and R⁴ are the same or different, and represent hydrogen or a hydrocarbon group having 1 to 6 carbon atoms, such as a straight-chain or branched alkyl group, alkenyl group and alkynyl group; and m is an integer of 1 to 4, and n is an integer of 2 or more.

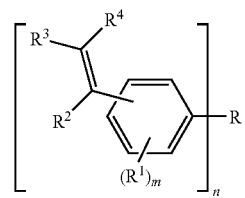

(2)

Specific examples of polyfunctional styrene compounds as described above include polyfunctional styrene compounds wholly having hydrocarbon skeletons described in JP Patent Publication (Kokai) No. 9-74255 (1997). Preferably usable are especially 1,2-bis(p-vinylphenyl)ethane, 1,2-bis(m-vinylphenyl)ethane, 1-(p-vinylphenyl)-2-(m-vinylphenyl)ethane, bis(p-vinylphenyl)methane, bis(m-vinylphenyl)methane, p-vinylphenyl-m-vinylphenylmethane, 1,4-bis(p-vinylphenyl)benzene, 1,4-bis(m-vinylphenyl)benzene, 1-(p-vinylphenyl)-4-(m-vinylphenyl)benzene, 1,3-bis(p-vinylphenyl)benzene, 1,3-bis(m-vinylphenyl)benzene, 1-(p- vinylphenyl)-3-(m-vinylphenyl)benzene, 1,6-bis(p-vinylphenyl)hexane, 1,6-bis(m-vinylphenyl)hexane, 1-(p-vinylphenyl)-6-(m-vinylphenyl)hexane, a divinylbenzene polymer (oligomer) having vinyl groups on the side chains, and the like. These are used singly or as a mixture of two or more. The polyfunctional styrene compounds preferably have a weight-average molecular weight in terms of polystyrene of 1,000 or less. If these polyfunctional styrene compounds are used as crosslinking components, since the styrene group has a high activity, a resin composition can be cured without using a polymerization initiator, so the polyfunctional styrene compounds are especially preferable as crosslinking components of insulating materials for high frequencies in that the increase in the dielectric loss tangent due to an influence of a polymerization initiator can be suppressed.

As bismaleimide compounds, compounds having a structure represented by the formula (3) below can suitably be used. In the formula (3), $R^5$s are the same or different, and represent a hydrocarbon group having 1 to 4 carbon atoms, such as a straight-chain or branched alkyl group, alkenyl group and alkynyl group; and l represents an integer of 1 to 4. The bismaleimide compounds represented by the formula (3) provide cured products thereof having dielectric loss tangents low for bismaleimide compounds though being inferior to the polyfunctional styrene compounds. This is considered due to an inhibiting effect of the intramolecular rotational motion by the steric hindrance of alkyl groups ($R^5$) present in their structure. Examples of the bismaleimide compounds having such a specified structure include bis(3-methyl-4-maleimidophenyl)methane, bis(3,5-dimethyl-4-maleimidophenyl)methane, bis(3-ethyl-4-maleimidophenyl)methane, bis(3-ethyl-5-methyl-4-maleimidophenyl)methane, and bis(3-n-butyl-4-maleimidophenyl)methane.

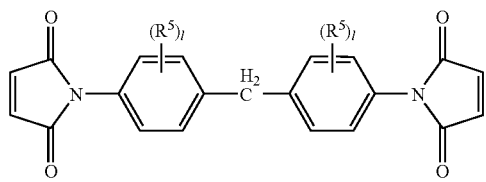

(3)

Curable polyphenylene ethers can suppress rising of the crosslinking density while they can cure the system. The curable polyphenylene ethers are compatible with after-mentioned non-reactive hydrogenated styrene-butadiene copolymers, contribute to the improvement in Tg of the system and the suppression of dissolving-out of the styrene-butadiene copolymers, and improve the non-tackiness. Further, since rising of the crosslinking density is suppressed, the curable polyphenylene ethers have an effect of improving the adhesiveness of a conductor layer with a prepreg cured product. Specific examples of the curable polyphenylene ethers include a maleic anhydride-modified polyphenylene ether and an allyl-modified polyphenylene ether described in JP Patent Publication (Kokai) No. 9-246429 (1997), and curable polyphenylene ethers having relatively small molecular weights described in JP Patent Publication (Kokai) Nos. 2003-160662, 2003-252983 and 2005-60635. These polyphenylene ether compounds have low dielectric properties for compounds containing hetero atoms.

These crosslinking components can be used by compositing them for aiming at adjustment of the non-tackiness, thermal properties, dielectric properties, crack resistance and the like. Further, second crosslinking components, for example, epoxy resins and cyanate ester resins, may be added within the acceptable range of dielectric properties.

Since hydrogenated styrene-butadiene copolymers have no polar group in their structure, they contribute to the reduction of the dielectric loss tangent of a cured product of a resin composition. The effect of reducing the dielectric loss tangent is larger than in the case of non-hydrogenated styrene-butadiene copolymers. Further, since the hydrogenated styrene-butadiene copolymers reduce the crosslinking density of the system, and impart flexibility thereto, they contribute to the improvement in the adhesiveness of a conductor layer with a prepreg cured product. Specific examples of hydrogenated styrene-butadiene copolymers include Taftec™ H1031, H1041, H1043, H1051 and H1052 made by Asahi Kasei Chemicals Corp. For a resin composition containing a polyfunctional styrene compound and a bismaleimide compound having a specified structure, a hydrogenated styrene-butadiene copolymer having a content rate of styrene residue of 30 to 70% by weight is preferably used. Thereby, a phase separation does not occur when the hydrogenated styrene-butadiene copolymer is used concurrently with a curable polyphenylene ether compound; and a cured product having a high glass transition temperature can be provided. In the case of a resin composition using a polybutadiene as a crosslinking component, a hydrogenated styrene-butadiene copolymer having a content rate of styrene residue of 10 to 30% by weight is preferably used. Thereby, as in the above example, a phase separation does not occur when the hydrogenated styrene-butadiene copolymer is used concurrently with a curable polyphenylene ether compound; and a cured product having a high glass transition temperature can be provided. A macromolecular substance like the hydrogenated styrene-butadiene copolymer has functions of increasing the viscosity of a resin varnish, improving the film formability, and stabilizing the adhesiveness of the resin varnish to a coarse quartz glass cloth. Hence, the addition amount of a hydrogenated styrene-butadiene copolymer is preferably 10 to 50 parts by weight, and more preferably 10 to 30 parts by weight, to 100 parts by weight of the total amount of crosslinking components. Within this composition range, a cured product is preferably adjusted for the solvent resistance, strength, film formability, non-tackiness and the like.

Polymerization initiators such as radical polymerization initiators have the effect of rapidly advancing the curing reaction of a system. The initiation temperature of the curing reaction can be regulated by the kind of radical polymerization initiators. Especially in a thermosetting resin composition using a polybutadiene as a crosslinking component, the curing degree of a system can be regulated by the addition amount of a radical polymerization initiator. Examples of radical polymerization initiators include isobutyl peroxide, α,α'-bis(neodecanoylperoxy)diisopropylbenzene, cumyl peroxyneodecanoate, di-n-propyl peroxydicarbonate, 1,1,3,3-tetramethylbutyl peroxyneodecanoate, diisopropyl peroxydicarbonate, 1-cyclohexyl-1-methylethyl peroxyneodecanoate, di-2-ethoxyethyl peroxydicarbonate, di(2-ethylhexylperoxy) dicarbonate, t-hexyl peroxyneodecanoate, dimethoxybutyl peroxydidecanoate, di(3-methyl-3-methoxybutylperoxy) dicarbonate, t-butyl peroxyneodecanoate, t-hexyl peroxypivalate, t-butyl peroxypivalate, 3,5,5-trimethylhexanoyl peroxide, octanoyl peroxide, 1,1,3,3-tetramethylbutylperoxy-2-ethyl hexanoate, 2,5-dimethyl-2,5-di(2-ethylhexanolyperoxy)hexane, 1-cyclohexyl-1-methylethylperoxy-2-ethyl hexanoate, t-hexylperoxy-2-ethyl hexanoate, t-butylperoxy-2-ethyl hexanoate, m-toluoyl peroxide, t-butyl peroxyisobutyrate, α,α'-bis(t-butylperoxy)

diisopropylbenzene, dicumyl peroxide, 2,5-dimethyl-2,5-di (t-butylperoxy)hexane, t-butylcumyl peroxide, di-t-butyl peroxide, 2,5-dimethyl-2,5-di(t-butylperoxy)hexyne-3, and t-butyltrimethylsilyl peroxide. These polymerization initiators can be used by compositing them. The addition amount thereof is regulated in the range of 0.0005 to 20 parts by weight to 100 parts by weight of the total amount of the resin components.

Polymerization inhibitors such as radical polymerization inhibitors have effects of suppressing the curing reaction due to overheating in fabricating varnishes and prepregs, and suppressing the progress of the curing reaction during prepreg storage. This stabilizes characteristics of the prepregs. The examples include quinones such as hydroquinone, p-benzoquinone, chloranil, trimethylquinone and 4-t-butylpyrocatechol, and aromatic diols. The preferable addition amount range is 0.0005 to 5 parts by weight to 100 parts by weight of the total of the resin components.

Electronic components are required to have flame retardancy in view of safety, and also in the present invention, a flame retardant is preferably added to a resin composition. As flame retardants, compounds represented by the formulae (4) and (5) shown below are especially suitably used,

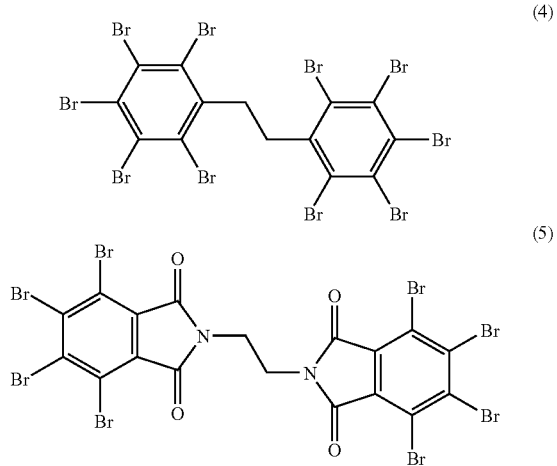

The flame retardants having the structures described above have low dielectric loss tangents, and are suitable for flame-proofing electronic components handling high-frequency signals. Especially in the present invention, the flame retardants can contribute to the reduction of the dielectric loss tangent of a cured product of a thermosetting resin composition containing a polybutadiene, a bismaleimide compound having a specified structure and a curable polyphenylene ether as crosslinking components, which is preferable. Further, making the average particle diameter of a flame retardant to be 0.2 to 3.0 μm can suppress precipitation of the flame retardant in a varnish to improve the storage stability of the varnish, which is preferable. Depending on the viscosity of a varnish, use of the flame retardant and the silicon oxide filler of the above-mentioned particle diameter ranges in a varnish of 0.1 to 1.0 Pa·s in viscosity can suppress occurrence of the precipitate. The addition amount of a flame retardant is preferably in the range of 10 parts by weight to 150 parts by weight to 100 parts by weight of the total amount of the resin components, and the formulation amount can be determined to the level of the required flame retardancy.

Solvents to make a thermosetting resin composition into a varnish are preferably ones having a boiling point of 140° C. or less, examples of which include xylene, and more preferably ones having a boiling point of 110° C. or less, examples of which include toluene and cyclohexane. These solvents may be used as a mixture thereof, and may further contain a polar solvent, such as methyl ethyl ketone or methanol, used in a coupling treatment.

A prepreg can be fabricated by impregnating a base material of a quartz glass cloth with the varnish, and drying it. The drying conditions involve a drying temperature of preferably 80° C. to 150° C., and more preferably 80° C. to 110° C., and a drying time preferably in the range of 10 min to 90 min.

The cured product of the fabricated prepreg is used as an insulating layer; and a conductor layer(s) is formed on both or one surface(s) of the insulating layer to manufacture a laminate. As the conductor layer, usually, a metal foil composed of a metal such as copper, nickel or aluminum is suitably used. The thickness of the metal foil is not especially limited, but is preferably relatively thin. A laminate can be obtained by disposing a metal foil(s) on one or both surfaces of a prepreg containing a plurality of prepreg sheets laminated as required, and pressing and heating them by a vacuum press or the like to cure the prepreg. Preferably, the pressure on pressing is 1.0 to 8.0 MPa; the pressing time is 30 to 120 min; and the pressing temperature is 170 to 230° C., but these conditions are not limited to these ranges because these conditions are different depending on compositions of resin compositions. The thickness of the insulating layer after curing is made thin by the effect of the quartz yarn being opened, and is reduced preferably to 10 to 50 μm per one layer of a prepreg. Hence, a laminate can be provided which has a thin insulating layer, excellent boring workability, and a low dielectric loss tangent. A conductor layer may be formed by suitably employing conventionally known electroless plating and vacuum deposition. Then, a circuit pattern (conductor wiring) is formed on the conductor layer of the laminate by means such as photolithography to obtain a printed wiring board. The conductor wiring may not be formed from a metal foil by photolithography, but may involve using a so-called lead frame, fabricated by previously punching a conductor wiring pattern, and laminating the lead frame on a cured product of a prepreg to manufacture a printed wiring board. Further, a multilayer printed wiring board can be manufactured by laminating successively a plurality of insulating layers composed of a cured product of a prepreg with a layer of conductor wiring interposed between the each insulating layer.

Since a cured product of a prepreg as described above has a low dielectric loss tangent and a low dielectric loss, the cured product can be suitably used as an insulating layer for electronic components having circuits to transmit electric signals of 1 GHz or more.

EXAMPLES

Then, the present invention will be described specifically by way of Examples and Comparative Examples, but the scope of the present invention is not limited thereto. Reagents and evaluation methods will be described hereinafter.

(1) Synthesis of 1,2-bis(vinylphenyl)ethane (BVPE)

As a polyfunctional styrene compound, 1,2-bis(vinylphenyl)ethane (BVPE) was synthesized. 5.36 g (220 mmol) of a granular magnesium for Grignard reaction (made by Kanto Chemical Co., Inc.) was charged in a three-neck flask of 500 ml, to which a dropping funnel, a nitrogen introducing pipe and a septum cap were attached. The entire system was heated to be dehydrated in a nitrogen gas flow by a drier while the magnesium particles were stirred by a stirrer. 300 ml of dried tetrahydrofuran was taken in a syringe, and injected into the flask through the septum cap. The solution was cooled to −5° C., and thereafter, 30.5 g (200 mmol) of vinylbenzyl chloride (made by Tokyo chemical Industry Co., Ltd.) was dropwise charged using the dropping funnel in about 4 hours. After the finish of the dropwise charge, the solution was continuously stirred at 0° C. for 20 hours. After the finish of the reaction, the reaction solution was filtered to remove residual magnesium, and concentrated by an evaporator. The concentrated solution was diluted with hexane, washed once with a 3.6% hydrochloric acid aqueous solution and three times with pure water, and then dehydrated with magnesium sulfate. The dehydrated solution was passed and purified through a short column of a silica gel (Wako gel, made by Wako Pure Chemical Industries, Ltd.)/hexane, and finally dried in a vacuum to obtain the target BVPE. The obtained BVPE was a mixture of 1,2-bis(p-vinylphenyl)ethane (pp component, solid), 1,2-bis(m-vinylphenyl)ethane (mm component, liquid) and 1-(p-vinylphenyl)-2-(m-vinylphenyl)ethane (mp component, liquid); and the yield was 90%.

Examination of the structure by $^1$H-NMR revealed the agreement with a literature value (6H-vinyl: α-2H (6.7), β-4H (5.7, 5.2); 8H-aromatic (7.1 to 7.4); 4H-methylene (2.9)). The obtained BVPE was used as a crosslinking component.

(2) Other Regents

A bismaleimide compound: BMI-5100, 3,3'-dimethyl-5,5'-diethyl-4,4'-diphenylmethane bismaleimide, made by Daiwakasei Industry Co., Ltd.

A high molecular weight polybutadiene: RB810, a number-average molecular weight in terms of styrene of 130,000, a 1,2-bond amount of 90% or more, made by JSR Corp.

A low molecular weight polybutadiene: B3000, a number-average molecular weight in terms of styrene of 3,000, a 1,2-bond amount of 90% or more, made by Nippon Soda Co., Ltd.

A hydrogenated styrene-butadiene copolymer:

Tuftec® H1031, a styrene content rate of 30% by weight, made by Asahi Kasei Chemicals Corp.

Tuftec® H1051, a styrene content rate of 42% by weight, made by Asahi Kasei Chemicals Corp.

A curable polyphenylene ether: OPE2St, a number-average molecular weight in terms of styrene of 2,200, styrene groups on both terminals, made by Mitsubishi Gas Chemical Co., Inc.

A polymerization initiator: 2,5-dimethyl-2,5-di(t-butylperoxy)hexyne-3 (abbr., 25B), made by NOF Corp.

A flame retardant: SAYTEX8010, 1,2-bis(pentabromophenyl)ethane, an average particle diameter of 1.5 μm, made by Albemarle Japan Corp.

A silicon oxide filler: Adomafine, an average particle diameter of 0.5 μm, made by Adomatex Co., Ltd.

A coupling agent: KBM-503, γ-methacryloxypropyldimethoxysilane, made by Shin-Etsu Chemical Co., Ltd.

A copper foil: AMFN1/2Oz, a coupling-treated copper, a thickness of 18 μm, Rz≅2.1 μm, made by Nikko Materials Co., Ltd.

Quartz glass cloths: Three kinds of quartz glass cloths made by Shin-Etsu Quartz Products Co., Ltd. were used. In each quartz glass cloth, the filament diameter of quartz glass fiber, the number of quartz glass fibers in a quartz yarn, and weaving densities of warp yarn and weft yarns were set as shown in Table 1.

TABLE 1

|  | No. 1 | No. 2 | No. 3 |
| --- | --- | --- | --- |
| Filament diameter (μm) | 7 | 7 | 7 |
| Number of filaments in a yarn | 20 | 40 | 200 |
| Number of warp yarns (yarns/25 mm) | 70 | 60 | 60 |
| Number of weft yarns (yarns/25 mm) | 70 | 43 | 58 |
| Weight (g/m$^2$) | 10 | 14 | 88 |
| Thickness (μm) | 20 | 21 | 94 |

(3) Surface Treatment of the Quartz Glass Cloths

The quartz glass cloths were immersed in a 0.5-wt % KBM-503 methanol solution for 1 hour, taken out from the solution, and heated and dried in the air at 100° C. for 3 hours in order to carry out a surface treatment.

(4) Preparation Method of a Varnish

Predetermined amounts of the coupling agent and the silicon oxide filler were stirred in a methyl ethyl ketone solution by a ball mill for 2 hours in order to subject the silicon oxide filler to a coupling treatment. Then, predetermined amounts of the resin material, the flame retardant, the polymerization initiator and toluene were added thereto, and continuously stirred for about 8 hours till the resin components were completely dissolved to fabricate a varnish. The varnish concentration was set at 40 to 45% by weight.

(5) Fabrication Method of a Prepreg

The quartz glass cloth was immersed in the varnish, thereafter pulled up vertically in a constant speed between a slit having a predetermined gap, and then dried to fabricate a prepreg. The coating amount of the resin composition was adjusted by the gap of the slit. The drying condition was at 100° C. for 10 min.

(6) Fabrication Method of a Copper-Clad Laminate

A plurality of the prepreg sheets fabricated as described above were laminated, sandwiched from the upper and lower surfaces between copper foils, pressed and heated by a vacuum press to cure the laminated material. For the curing, the laminated material was pressed at 6 MPa from room temperature and heated at a constant temperature rising rate (6° C./min) and held at 230° C. for 60 min.

(7) Fabrication Method of a Resin Plate (Reference Example)

The resin varnish described above was applied on a PET film, dried at room temperature over night and at 100° C. for 10 min, thereafter peeled off, filled in a PTFE spacer of 1.0 mm in thickness, and pressed and heated by a vacuum press to obtain a cured product (resin plate). For the curing, the filled resin varnish was pressed at 2 MPa under vacuum from room temperature and heated at a constant temperature rising rate (6° C./min) and held at 230° C. for 60 min. The resin plate was measured for the relative permittivity and the dielectric loss tangent as Reference Example.

(8) Measurements of the Relative Permittivity and the Dielectric Loss Tangent

The relative permittivity and the dielectric loss tangent at 10 GHz were measured by the cavity resonance method (8722ES Network Analyzer, made by Agilent Technologies Japan, Ltd.; cavity resonator, made by Kantoh electronics Application and Development Inc.). With respect to a sample fabricated from the copper-clad laminate, copper was removed by etching, and thereafter, the resin plate was cut out into a size of 1.0×80 mm to fabricate the sample. With respect to a sample fabricated from the resin plate, the resin plate was cut out into a size of 1.0×1.5×80 mm to fabricate the sample.

(9) Evaluations of Thermal and Mechanical Properties

The elastic modulus of the resin plate was observed using DVA-200 Viscoelastic Analyzer (DMA), made by IT Keisoku Seigyo KK, under the conditions of a span of 20 mm, a measurement frequency of 10 Hz and a temperature rising rate of 10° C./min. The sample size was 1.0×1.5×30 mm.

The thermal expansion coefficient was observed using TM9300 thermomechanical analyzer, made by Ulvac-Riko, Inc. The resin plate and the laminate were cut out into a size of 5×5 mm to make samples.

Example 1

Example 1 was an example of fabricating a laminate using the quartz glass cloth No. 1. The measurement results are shown in Table 2. Reducing the number of fibers constituting a quartz yarn to 20 fibers reduced the thickness of the quartz glass cloth to 20 μm and the weight per unit area thereof to 10 g/m². Hence, it was confirmed that reducing the fiber number in a yarn and making the weaving density low without making the quartz glass fibers excessively fine could reduce the layer thickness and the weight of the quartz glass cloth. The prepreg having a resin composition content rate of 60% by weight had a thickness of 23 μm, but a laminated prepreg obtained by laminating and pressing 36 sheets of the original prepreg had a thickness of 590 μm, that is, an insulating layer thickness per layer of 16 μm, which indicated that the press work could further reduce the layer thickness. The permittivity and the dielectric loss tangent of the laminate at 10 GHz exhibited low values of 3.0 and 0.0011, respectively, which revealed that the laminate is suitable for insulating materials for high frequencies.

Example 2

Example 2 was an example of fabricating a laminate using the quartz glass cloth No. 2. The measurement results are shown in Table 2. Reducing the number of fibers constituting a quartz yarn to 40 fibers reduced the thickness of the quartz glass cloth to 21 μm and the weight per unit area thereof to 14 g/m². Hence, it was confirmed that reducing the fiber number in a yarn and making the weaving density low without making the quartz glass fibers excessively fine could reduce the layer thickness and the weight of the quartz glass cloth. The prepreg having a resin composition content rate of 60% by weight had a thickness of 33 μm, but a laminated prepreg obtained by laminating and pressing 36 sheets of the original prepreg had a thickness of 688 μm, that is, an insulating layer thickness per layer of 19 μm, which indicated that the press work could further reduce the layer thickness. The permittivity and the dielectric loss tangent of the laminate at 10 GHz exhibited low values of 3.0 and 0.0011, respectively, which revealed that the laminate is suitable for insulating materials for high frequencies. Observation of the cross-section of the laminate confirmed that the quartz glass fibers constituting the quartz yarns were opened. FIG. 1 shows quartz yarns in a prepreg before the press work and quartz yarns in a laminate after the press work by comparison. Hence, it was confirmed that the press work opened the quartz glass fibers in the quartz yarns. It was found that in the prepreg using a quartz glass cloth having a coarse structure of the present invention, press work progresses the opening of fibers, and contributes to a further reduction of the insulating layer thickness.

Comparative Example 1

Figure 2:
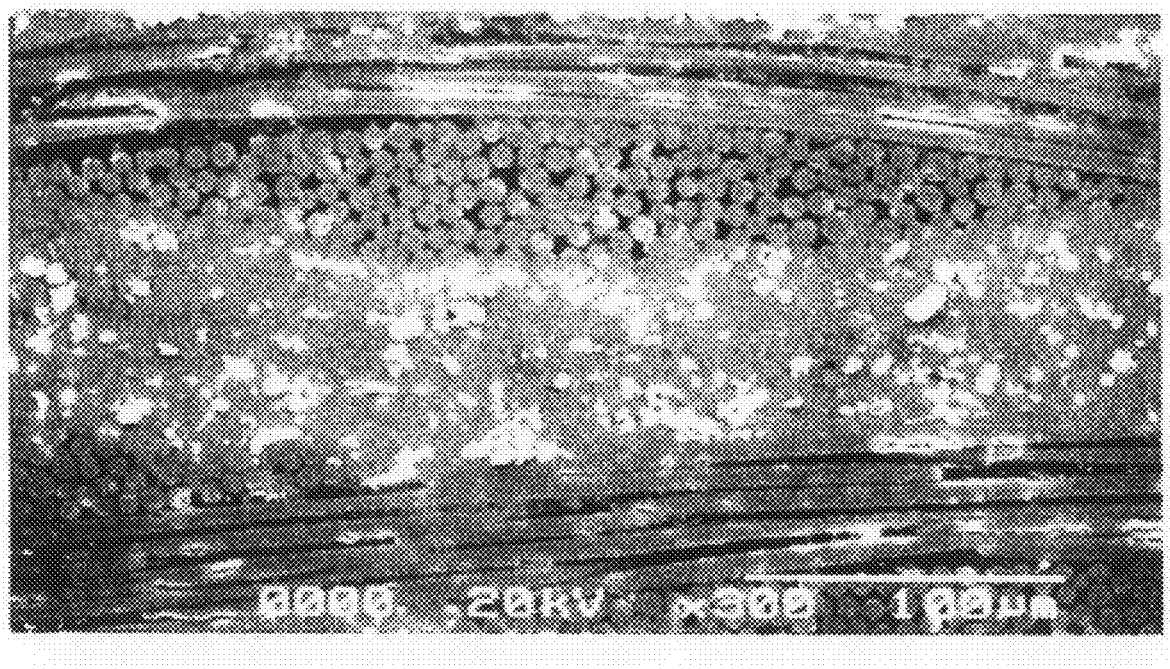
FIG. 2 is a cross-sectional photograph of a laminate using a conventional quartz glass cloth.

Comparative Example 1 was an example of fabricating a laminate using the quartz glass cloth No. 3. The measurement results are shown in Table 2. Since the fiber number constituting a quartz yarn is as many as 200 fibers, the thickness of the quartz glass cloth was as thick as 94 μm; and the weight per unit area thereof was as heavy as 88 g/m². The prepreg having a resin composition content rate of 60% by weight had a thickness of 135 μm, and a laminated prepreg obtained by laminating and pressing 6 sheets of the original prepreg had a thickness of 790 μm, that is, a thickness per layer of 131 μm, which indicated that the press work could hardly reduce the layer thickness. FIG. 2 shows the cross-sectional photograph. It was confirmed that since the fiber number forming a yarn is large and quartz glass fibers are densely arranged, the press work can hardly generate the opening. In the case of using the quartz glass cloth having a conventional structure, although the permittivity and the dielectric loss tangent of the laminate at 10 GHz were as low as 3.0 and 0.0011, respectively, the improvement in the boring workability cannot be expected because the insulating layer thickness was thick and the quartz glass fibers were densely arranged.

TABLE 2

| Material name | Product name | | Reference Example | Example 1 | Example 2 | Comparative Example 1 |
|---|---|---|---|---|---|---|
| Low molecular weight polybutadiene | B3000 | | | 50 | | |
| High molecular weight polybutadiene | RB810 | | | 50 | | |
| Curable polyphenylene ether | OPE2St | | | 30 | | |
| Macromolecular substance (rubber component) | H1031 | | | 20 | | |
| Flame retardant | SAYTEX8010 | | | 190 | | |
| Silicon oxide filler | SO25R | | | 200 | | |
| Coupling agent | KBM503 | | | 1 | | |
| Polymerization initiator | Perhexyne 25B | | | 2 | | |
| Base material | Quartz glass cloth No. | | None | No. 1 | No. 2 | No. 3 |
| | Base material thickness (μm) | | | 20 | 21 | 94 |
| | Base material weight (g/m²) | | | 10 | 14 | 88 |
| Prepreg | Resin composition content rate (wt %) | | 100 | 60 | 60 | 60 |
| | Thickness (μm) | | — | 23 | 33 | 135 |

TABLE 2-continued

| Material name | Product name | Reference Example | Example 1 | Example 2 | Comparative Example 1 |
|---|---|---|---|---|---|
| Properties of laminate | Number of laminated sheets (sheets) | — | 36 | 36 | 6 |
| | Laminate thickness (μm) | — | 590 | 688 | 790 |
| | Thickness per layer (μm) | — | 16 | 19 | 131 |
| | Relative permittivity at 10 GHz | 2.8 | 3.0 | 3.0 | 3.0 |
| | Dielectric loss tangent at 10 GHz | 0.0015 | 0.0011 | 0.0011 | 0.0011 |
| | Thermal expansion coefficient in Z direction (ppm/° C., 50 to 100° C.) | 49 | 60 | 61 | 60 |

Examples 3 to 5

Examples 3 to 5 were examples of using the quartz glass cloth No. 2 and using prepregs whose content rates of the resin composition were varied. The measurement results are shown in Table 3. It was confirmed that the thermal expansion coefficient and also the dielectric loss tangent of the laminate decreased with the decreasing content rate of the resin composition. Hence, it was found that a laminate, printed wiring board and multilayer printed wiring board using the prepreg of the present invention are excellent in both the high-frequency properties and the low thermal expansion.

TABLE 3

| Material name | Product name | Reference Example | Example 3 | Example 4 | Example 5 |
|---|---|---|---|---|---|
| Low molecular weight polybutadiene | B3000 | | 50 | | |
| High molecular weight polybutadiene | RB810 | | 50 | | |
| Curable polyphenylene ether | OPE2St | | 30 | | |
| Macromolecular substance (rubber component) | H1031 | | 20 | | |
| Flame retardant | SAYTEX8010 | | 190 | | |
| Silicon oxide filler | SO25R | | 200 | | |
| Coupling agent | KBM503 | | 1 | | |
| Polymerization initiator | Perhexyne 25B | | 2 | | |
| Base material | Quartz glass cloth No. | None | | No. 2 | |
| | Base material thickness (μm) | | | 21 | |
| | Base material weight (g/m²) | | | 14 | |
| Prepreg | Resin composition content rate (wt %) | 100 | 55 | 60 | 80 |
| | Thickness (μm) | — | 32 | 33 | 70 |
| Properties of laminate | Number of laminated sheets (sheets) | — | 36 | 36 | 36 |
| | Laminate thickness (μm) | — | 613 | 684 | 1600 |
| | Thickness per layer (μm) | — | 17 | 19 | 44 |
| | Relative permittivity at 10 GHz | 2.8 | 3.1 | 3.0 | |
| | Dielectric loss tangent at 10 GHz | 0.0015 | 0.0009 | 0.0011 | 0.0013 |
| | Thermal expansion coefficient in Z direction (ppm/° C., 50 to 100° C.) | 49 | 50 | 61 | 80 |

Example 6

Example 6 was an example of using the thermosetting resin composition of low thermal expansion containing the polyfunctional styrene compound as a crosslinking component. The properties are shown in Table 4. It was found that since the cured product of the resin composition was made to be of low thermal expansion, the thermal expansion coefficient in the Z direction of the laminate was further reduced, which is preferable as a multilayer board material for high frequencies.

TABLE 4

| Material name | Product name | Reference Example | Example 6 |
|---|---|---|---|
| Polyfunctional styrene compound | BVPE | | 20 |
| Curable polyphenylene ether | OPE2St | | 47 |

TABLE 4-continued

| Material name | Product name | Reference Example | Example 6 |
|---|---|---|---|
| Macromolecular substance (rubber component) | H1051 | | 33 |
| Flame retardant | SAYTEX8010 | | 33 |
| Silicon oxide filler | SO25R | | 230 |
| Coupling agent | KBM503 | | 0.1 |
| Polymerization inhibitor | tBHQ | | 0.05 |
| Base material | Quartz glass cloth No. | None | No. 2 |
| | Base material thickness (μm) | | 21 |
| | Base material weight (g/m$^2$) | | 14 |
| Prepreg | Resin composition content rate (wt %) | 100 | 55 |
| | Thickness (μm) | — | 32 |
| Properties of laminate | Number of laminated sheets (sheets) | — | 36 |
| | Laminate thickness (μm) | — | 614 |
| | Thickness per layer (μm) | — | 17 |
| | Relative permittivity at 10 GHz | 2.8 | 3.1 |
| | Dielectric loss tangent at 10 GHz | 0.0012 | 0.0009 |
| | Thermal expansion coefficient in Z direction (ppm/° C., 50 to 100° C.) | 25 | 40 |

Example 7

Example 7 was an example of using the thermosetting resin composition of low thermal expansion containing the bismaleimide compound having a specified structure as a crosslinking component. The properties are shown in Table 5. It was found that since the cured product of the resin composition was made to be of low thermal expansion, the thermal expansion coefficient in Z direction of the laminate was further reduced, which is preferable as a multilayer board material for high frequencies.

TABLE 5

| Material name | Product name | Reference Example | Example 7 |
|---|---|---|---|
| Bismaleimide compound | BMI5100 | | 20 |
| Curable polyphenylene ether | OPE2St | | 47 |
| Macromolecular substance (rubber component) | H1051 | | 33 |
| Flame retardant | SAYTEX8010 | | 33 |
| Silicon oxide filler | SO25R | | 230 |
| Coupling agent | KBM503 | | 0.1 |
| Polymerization initiator | Perhexyne 25B | | 0.1 |
| Polymerization inhibitor | tBHQ | | 0.05 |
| Base material | Quartz glass cloth No. | None | No. 2 |
| | Base material thickness (μm) | | 21 |
| | Base material weight (g/m$^2$) | | 14 |
| Prepreg | Resin composition content rate (wt %) | 100 | 55 |
| | Thickness (μm) | — | 32 |

TABLE 5-continued

| Material name | Product name | Reference Example | Example 7 |
|---|---|---|---|
| Properties of laminate | Number of laminated sheets (sheets) | — | 36 |
| | Laminate thickness (μm) | — | 614 |
| | Thickness per layer (μm) | — | 17 |
| | Relative permittivity at 10 GHz | 2.8 | 3.1 |
| | Dielectric loss tangent at 10 GHz | 0.0018 | 0.0014 |
| | Thermal expansion coefficient in Z direction (ppm/° C., 50 to 100° C.) | 24 | 40 |

Example 8

Example 8 was an example in which the thermosetting low-elasticity resin composition and the quartz glass cloth were composited. The properties are shown in Table 6. It was confirmed that since the elastic modulus of the cured product of the resin was low and the base material was the quartz glass cloth of low thermal expansion, the thermal expansion coefficient in XY directions of the laminate was very low. Further, the laminate caused almost no warpage due to that the laminate was thin and the elastic modulus of the cured resin phase was low. Further, the laminate exhibited a very low dielectric loss tangent at 10 GHz of 0.0009. It was found that a laminate, printed wiring board and multilayer printed wiring board composed of the prepreg obtained by compositing the thermosetting low-elasticity resin composition and the coarse quartz glass cloth are multilayer board materials for high frequencies having a high dimensional stability.

TABLE 6

| Material name | Product name | Reference Example | Example 8 |
|---|---|---|---|
| Low molecular weight polybutadiene | B3000 | | 70 |
| High molecular weight polybutadiene | RB810 | | — |
| Curable polyphenylene ether | OPE2St | | — |
| Macromolecular substance (rubber component) | H1031 | | 30 |
| Flame retardant | SAYTEX8010 | | 33 |
| Silicon oxide filler | SO25R | | 63 |
| Coupling agent | KBM503 | | 0.6 |
| Polymerization initiator | Perhexyne 25B | | 2.8 |
| Base material | Quartz glass cloth No. | None | No. 2 |
| | Base material thickness (μm) | | 21 |
| | Base material weight (g/m$^2$) | | 14 |
| Prepreg | Resin composition content rate (wt %) | 100 | 60 |
| | Thickness (μm) | — | 33 |
| Properties of laminate | Number of laminated sheets (sheets) | — | 2 |
| | Laminate thickness (μm) | — | 38 |
| | Thickness per layer (μm) | — | 19 |
| | Relative permittivity at 10 GHz | 2.5 | 2.7 |
| | Dielectric loss tangent at 10 GHz | 0.0011 | 0.0009 |
| | Elastic modulus at 20° C. (MPa) | 450 | 1000 |

TABLE 6-continued

| Material name | Product name | Reference Example | Example 8 |
|---|---|---|---|
| | Thermal expansion coefficient in XY directions (ppm/° C., 50 to 100° C.) | 130 | 2 |

Example 9

Figure 3:
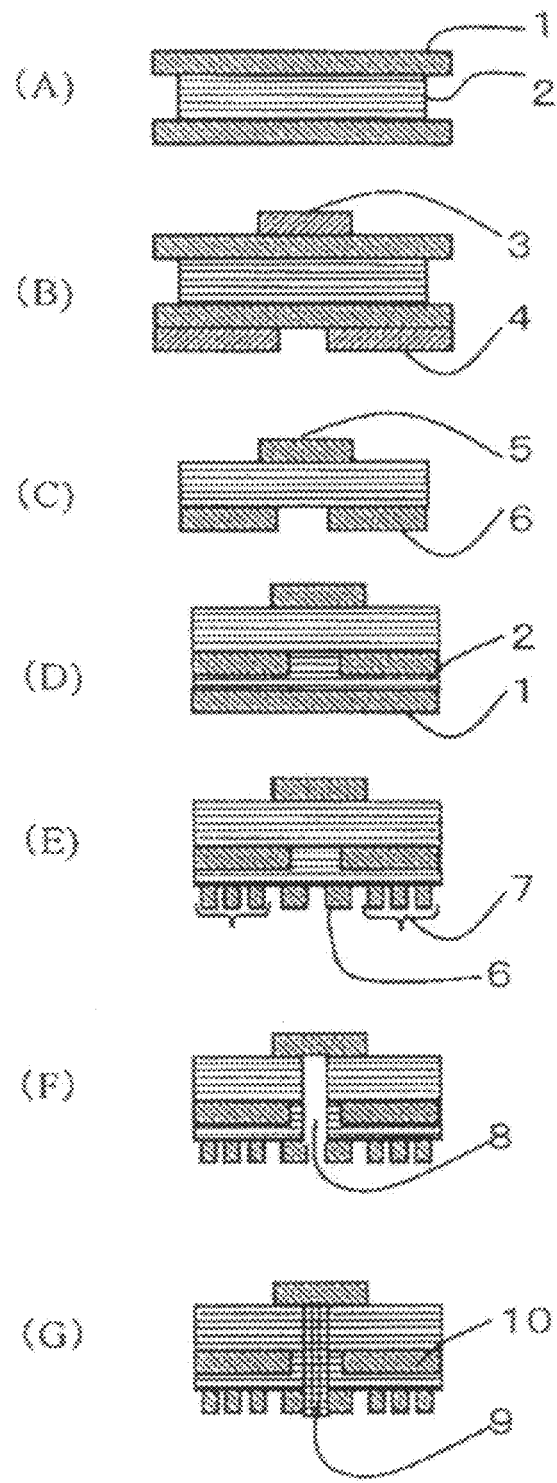
FIG. 3 is an illustrative view showing a fabrication process of an antenna circuit built-in high-frequency board.

In Example 9, an antenna circuit built-in high-frequency board using the pregreg of Example 5 was fabricated. The fabrication process is shown in FIG. 3.
(A) The prepreg 2 of Example 5 was cut into 10×10 cm, and 10 cut sheets thereof were laminated and interposed between two sheets of cooper foil 1. The resultant laminate was heated at a temperature rising rate of 6° C./min under vacuum and held at 230° C. for 1 hour while being pressed at a pressure of 5 MPa by a vacuum press, to fabricate a double-sided copper-clad laminate. Then, the double-sided copper-clad laminate was immersed in an etching solution (ammonium persulfate peroxide: 200 g/l, sulfuric acid: 50 g/l) at 30° C. for 10 min to reduce the copper layer thicknesses to 8 μm.
(B) A photo resist 4 (HS425, made by Hitachi Chemical Co., Ltd.) was laminated on one surface of the copper-clad laminate; an antenna circuit connection through-hole portion was masked and the photo resist was exposed. Then, a photo resist 3 (HS425, made by Hitachi Chemical Co., Ltd.) was laminated on the surface of the other copper foil, and exposed to an antenna test pattern; and the photo resist of unexposed portions on both the surfaces were developed with a 1% sodium carbonate solution.
(C) The exposed copper foils were removed by etching with an etching solution of 5% sulfuric acid and 5% hydrogen peroxide to fabricate an antenna pattern 5 and a through-hole pattern 6 on the double-sided copper-clad laminate. The residual photo resist was removed with a 3% sodium hydroxide solution.
(D) A copper foil 1 was laminated on the through-hole pattern 6 side via a sheet of the prepreg 2, and subjected to press work and multilayered under the same conditions as in (A).
(E) A wiring pattern 7 and a through-hole pattern 6 were made on the newly disposed conductor layer by the same methods as in (B) and (C).
(F) A through-hole 8 was formed by a carbon dioxide laser with the outer layer through-hole pattern 6 used as a mask.
(G) A silver paste 9 was introduced in the through-hole 8, and the antenna circuit and the wiring on the back surface were connected to fabricate an antenna circuit built-in high-frequency board having a shielding layer right underneath the antenna circuit. The reference numeral 10 was a ground.

The prepreg, laminate, printed wiring board and multilayer printed wiring board of the present invention are thin, light in weight and excellent in workability, and low in the dielectric loss tangent and low in the dielectric loss, and are therefore suitable as insulating materials and printed wiring boards of high-speed servers, routers, and high frequency-capable electronic apparatuses such as millimeter-wave radars.

What is claimed is:
1. A prepreg, obtained by compositing a quartz glass cloth and a thermosetting resin composition,
the quartz glass cloth being fabricated using a quartz yarn comprising 15 to 49 quartz glass fibers having a filament diameter of 5 to 9 μm, and having weaving densities of warp yarn and weft yarn each of 30 to 70 yarns/25 mm,
the thermosetting resin composition after curing having a dielectric loss tangent of 0.003 or less,
wherein the prepreg has a thickness of 30 to 60 μm.
2. The prepreg according to claim 1, wherein the prepreg has a content of the thermosetting resin composition of 50 to 80% by weight.
3. The prepreg according to claim 1, wherein the thermosetting resin composition comprises:
at least one crosslinking component selected from a polybutadiene represented by the formula (1), a polyfunctional styrene compound represented by the formula (2), a bismaleimide compound represented by the formula (3) and a thermosetting polyphenylene ether;
a hydrogenated styrene-butadiene copolymer;
a silicon oxide filler; and
a flame retardant having a structure represented by the formula (4) or the formula (5):

(1)

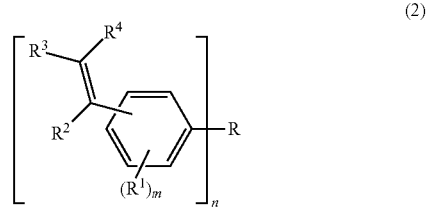

(2)

wherein R represents a hydrocarbon skeleton; $R^1$s are the same or different, and represent hydrogen or a hydrocarbon group having 1 to 20 carbon atoms; $R^2$, $R^3$ and $R^4$ are the same or different, and represent hydrogen or a hydrocarbon group having 1 to 6 carbon atoms; m is an integer of 1 to 4, and n is an integer of 2 or more; and a polyfunctional styrene compound represented by the formula (2) has a weight-average molecular weight in terms of polystyrene of 1,000 or less,

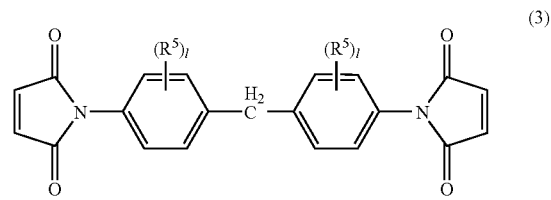

(3)

wherein $R^5$s are the same or different, and represent a hydrocarbon group having 1 to 4 carbon atoms; and I represents an integer of 1 to 4,

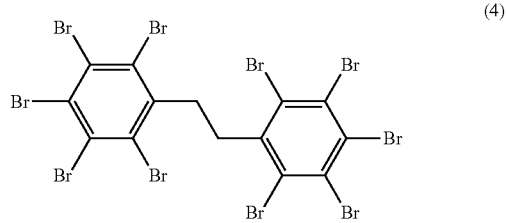

(4)

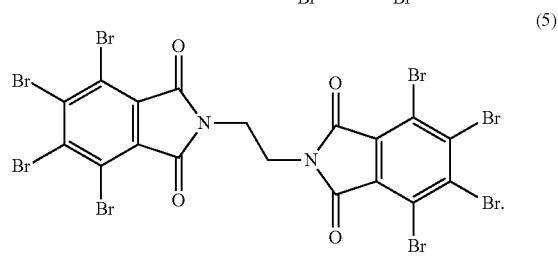

(5)

4. A prepreg, obtained by compositing a quartz glass cloth and a thermosetting resin composition, the quartz glass cloth being fabricated using a quartz yarn comprising a quartz glass fiber as a main component, and having a low fiber density of the quartz glass fiber, the thermosetting resin composition after curing having a dielectric loss tangent of 0.003 or less, wherein the prepreg has a thickness of 30 to 60 μm, and wherein the thermosetting resin composition comprises:

at least one crosslinking component selected from a polybutadiene represented by the formula (1), a polyfunctional styrene compound represented by the formula (2), a bismaleimide compound represented by the formula (3) and a thermosetting polyphenylene ether;

a hydrogenated styrene-butadiene copolymer;

a silicon oxide filler; and a flame retardant having a structure represented by the formula (4) or the formula (5):

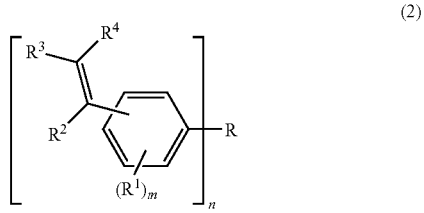

(2)

wherein R represents a hydrocarbon skeleton; $R^1$s are the same or different, and represent hydrogen or a hydrocarbon group having 1 to 20 carbon atoms; $R^2$, $R^3$ and $R^4$ are the same or different, and represent hydrogen or a hydrocarbon group having 1 to 6 carbon atoms; m is an integer of 1 to 4, and n is an integer of 2 or more; and a polyfunctional styrene compound represented by the formula (2) has a weight-average molecular weight in terms of polystyrene of 1,000 or less,

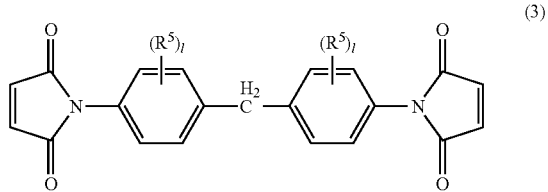

(3)

wherein $R^5$s are the same or different, and represent a hydrocarbon group having 1 to 4 carbon atoms; and l represents an integer of 1 to 4,

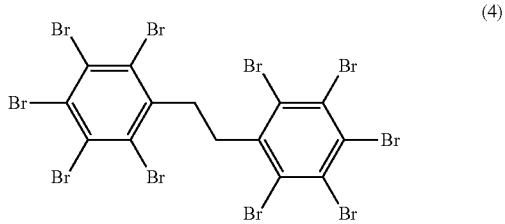

(4)

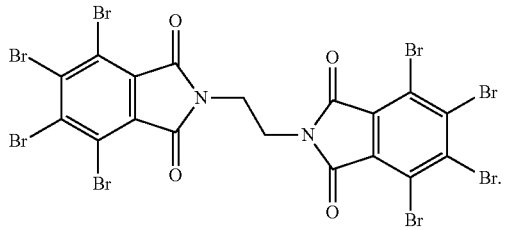

(5)

5. The prepreg according to claim 4, wherein the thermosetting resin composition further comprises a polymerization inhibitor or a polymerization initiator.

6. The prepreg according to claim 4, wherein a cured product of the thermosetting resin composition has a thermal expansion coefficient at 50 to 100° C. of 50 ppm/° C. or less.

7. The prepreg according to claim 4, wherein a cured product of the thermosetting resin composition has a storage elastic modulus at 20° C. of 300 to 1,700 MPa.

8. A laminate, comprising a conductor layer(s) on both surfaces or one surface of an insulating layer made of a cured product of the prepreg according to claim 1.

9. The laminate according to claim 8, wherein the insulating layer has a thickness of 10 to 50 μm.

10. A printed wiring board, comprising a conductor wiring(s) on both surfaces or one surface of an insulating layer made of a cured product of the prepreg according to claim 1.

11. The printed wiring board according to claim 10, wherein the insulating layer has a thickness of 10 to 50 μm.

12. A multilayer printed wiring board, obtained by laminating a plurality of insulating layers made of a cured product of the prepreg according to claim 1 with a conductor wiring layer interposed between two insulating layers.

13. A multilayer printed wiring board, obtained by laminating a plurality of insulating layers made of a cured product of a prepreg with a conductor wiring layer interposed between two insulating layers, wherein said prepreg is obtained by compositing a quartz glass cloth and a thermosetting resin composition, the quartz glass cloth being fabricated using a quartz yarn comprising a quartz glass fiber as a main component, and having a low fiber density of the quartz glass fiber, the thermosetting resin composition after curing having a dielectric loss tangent of 0.003 or less, wherein the prepreg has a thickness of 30 to 60 μm.

14. The multilayer printed wiring board according to claim 13, wherein the insulating layer has a thickness of 10 μm to 50 μm.

15. An electronic component having a circuit to transmit an electric signal of 1 GHz or more, the electronic component comprising a cured product of the prepreg according to claim 1 used as an insulating layer of the electronic component.

16. The prepreg according to claim 1, wherein said quartz yarn comprises 15 to 40 quartz glass fibers having a filament diameter of 5 to 9 μm.

17. The prepreg according to claim 1, wherein the thermosetting resin composition after curing has a dielectric loss tangent of 0.003 or less at 10 GHz.

18. The prepreg according to claim 1, wherein the quartz glass cloth has a weight per unit area of 10 to 18 g/m².

19. The prepreg according to claim 1, wherein the quartz glass cloth has a thickness of 15 to 30 μm.

* * * * *